(12) United States Patent
Toriya et al.

(10) Patent No.: US 10,094,019 B2
(45) Date of Patent: Oct. 9, 2018

(54) FILM FORMING APPARATUS

(71) Applicant: TOKYO ELECTRON LIMITED, Tokyo (JP)

(72) Inventors: Daisuke Toriya, Nirasaki (JP); Eiichi Komori, Nirasaki (JP); Manabu Amikura, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 769 days.

(21) Appl. No.: 14/074,302

(22) Filed: Nov. 7, 2013

(65) Prior Publication Data
US 2014/0130743 A1    May 15, 2014

(30) Foreign Application Priority Data
Nov. 15, 2012  (JP) ................. 2012-251595

(51) Int. Cl.
| | |
|---|---|
| H01L 21/687 | (2006.01) |
| C23C 16/455 | (2006.01) |
| C23C 16/458 | (2006.01) |
| H01L 21/02 | (2006.01) |
| C23C 16/44 | (2006.01) |

(52) U.S. Cl.
CPC .... *C23C 16/45544* (2013.01); *C23C 16/4412* (2013.01); *C23C 16/4585* (2013.01); *C23C 16/45565* (2013.01); *C23C 16/45574* (2013.01); *H01L 21/02175* (2013.01); *H01L 21/68721* (2013.01)

(58) Field of Classification Search
CPC ........ C23C 16/45544; C23C 16/45565; C23C 16/45574; C23C 16/4585; C23C 16/4412; H01L 21/02175; H01L 21/68721
See application file for complete search history.

(56) References Cited

U.S. PATENT DOCUMENTS 5,437,757 A  *  8/1995  Rice ................. H01L 21/68721
                                                              118/728
5,851,299 A  *  12/1998  Cheng .................... C23C 16/04
                                                              118/500
(Continued)

FOREIGN PATENT DOCUMENTS

| JP | H04-268124 A |   | 9/1992 |
|---|---|---|---|
| JP | 06208959 A | * | 7/1994 |

(Continued)

*Primary Examiner* — Yuechuan Yu
(74) *Attorney, Agent, or Firm* — Nath, Goldberg & Meyer; Jerald L. Meyer

(57) ABSTRACT

A film forming apparatus that includes a mounting table for loading a wafer, a encompassing member surrounding the mounting table and dividing an inside of a process container, an exhaust part that vacuum exhausts the process container, a clamp ring loaded upon an upper space of the encompassing member and lifted from the upper space of the encompassing member while contacting an inner circumference part thereof with an outer circumference of the wafer loaded on the mounting table, and a cylindrical wall extended downward from the clamp ring, formed along a circumference of the clamp ring into a cylinder shape, and positioned between an outer circumference surface of the mounting table and an inner circumference surface of the encompassing member.

9 Claims, 11 Drawing Sheets

(56) References Cited

U.S. PATENT DOCUMENTS

| 6,733,593 B1 * | 5/2004 | Tanaka ................... C23C 16/04 |
| | | 118/724 |
| 2012/0042825 A1 * | 2/2012 | Hawrylchak ....... C23C 16/4585 |
| | | 118/504 |

FOREIGN PATENT DOCUMENTS

| JP | 6-295872 A | | 10/1994 |
| JP | 08191096 A | * | 7/1996 |
| JP | 2000-208439 A | | 7/2000 |
| JP | 2010-212452 A | | 9/2010 |
| JP | 2010-225740 A | | 10/2010 |

* cited by examiner

FILM FORMING APPARATUS

CROSS-REFERENCE TO RELATED APPLICATIONS

This application claims the benefit of Japanese Patent Application No. 2012-251595, filed on Nov. 15, 2012, in the Japan Patent Office, the disclosure of which is incorporated herein in its entirety by reference.

TECHNICAL FIELD

The present disclosure relates to a film forming apparatus performing film forming process by providing a reaction gas to a wafer positioned in a process container.

BACKGROUND

As film forming methods to form a film on a substrate, e.g., a semiconductor wafer (hereinafter, referred to as a "wafer"), there are known methods such as a chemical vapor deposition (CVD) method for depositing sediment by reacting reaction gases on a surface of the wafer and an atomic layer deposition (ALD) method or a multi-layer deposition method (MLD) for depositing sediment by sequentially providing a plurality of reaction gases, which are reactive to each other, to the wafer to thereby absorb the reaction gases and deposit sediment onto a surface of the wafer (hereinafter, generally referred to as a ALD method).

Some of the reaction gases, which are easy to penetrate into a gap between members among various reaction gases used in the CVD method or the ALD method, may penetrate into a gap between the wafer and a mounting table thereof. Such penetration causes a film forming even on a lateral side or a back side of the wafer. If the film forming is performed on these regions, particles may be generated due to the contact with a transfer arm for transferring the wafer, which may become a pollution source of the wafer.

For example in a conventional film forming method, there is a technology where an edge part of the wafer positioned on a mounting table is covered by using a circular shaped clamp ring to thereby limit an area on which the film forming process is performed. However, it may be difficult to prevent the film formation at a back side of the wafer just by contacting the clamp ring because the reaction gases are likely to penetrate into the gap between the members (referred to as penetrability). Thus, the conventional film forming method is not capable of preventing reaction gases with high penetrability from moving to the back of the wafer.

SUMMARY

The present disclosure takes above observations into consideration and provides a film forming apparatus, which is capable of preventing reaction gases from moving to the back of a wafer.

According to the present disclosure, a film forming apparatus performing a film formation by supplying a reaction gas to a wafer positioned in a process container having a vacuum atmosphere, the film forming apparatus comprising: a mounting table, on which the wafer is mounted, installed in the processing container and configured to be lifted/lowered between a processing location for performing the film formation and a delivery location for delivering the wafer from outside of the processing container at a lower side of the processing location; an encompassing member configured to encompass the mounting table positioned at the processing location and to divide an inside of the processing container into a processing space of an upper side in which the reaction gas is supplied and a space of a lower side; an exhaust part configured to perform vacuum exhaustion inside the processing container through the processing space; a clamp ring stacked on an upper surface of the encompassing member when the mounting table is positioned at the delivery location and lifted from the upper surface of the encompassing member while contacting an inner circumference part thereof with an outer circumference of the wafer mounted on the mounting table when the mounting table rises to the processing location; and a cylindrical wall extended downward from the clamp ring, formed along circumference of the clamp ring in a cylinder shape, and positioned between an outer circumference surface of the mounting table and an inner circumference surface of the encompassing member.

Furthermore, another film forming apparatus performing a film formation by supplying a reaction gas to a wafer positioned in a process container having a vacuum atmosphere, the film forming apparatus comprising: a mounting table, on which the wafer is mounted, installed in the processing container and configured to be lifted/lowered between a processing location for performing the film formation and a delivery location for delivering the wafer from outside of the processing container at a lower side of the processing location; an encompassing member configured to encompass the mounting table positioned at the processing location and to divide an inside of the processing container into a processing space of an upper side in which the reaction gas is supplied and a space of a lower side; an exhaust part configured to perform vacuum exhaustion inside the processing container through the processing space; a purge gas supply unit configured to supply a purge gas to the lower side space; a clamp ring stacked on an upper surface of the encompassing member when the mounting table is positioned at the delivery location and lifted from the upper surface of the encompassing member while contacting an inner circumference part thereof with an outer circumference of the wafer mounted on the mounting table when the mounting table rises to the processing location; and a guiding part formed at the encompassing member to be extended between an upper side of the mounting table positioned at the processing location and a lower side of the clamp ring and to guide a flow of the purge gas, provided from the purge gas supplying part, for passing through a lateral side of the wafer mounted on the mounting table and flowing into the process space.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Possible problems arising from using reaction gases with high penetrability into a gap between members will be described. Next, a detailed configuration of a film forming apparatus, according to one embodiment of the present disclosure, will be discussed.

The inventor has found that reaction gases, which have been used as metal source gases in forming metal films of ruthenium (Ru) and nickel (Ni) or their oxide films (e.g., $RuO_2$, $RuO_4$, NiO, $Ni_2O_3$, $NiO_2$, etc.), have high penetrability. These films may be used as an electrode or an insulation film of a semiconductor device.

Figure 1A:
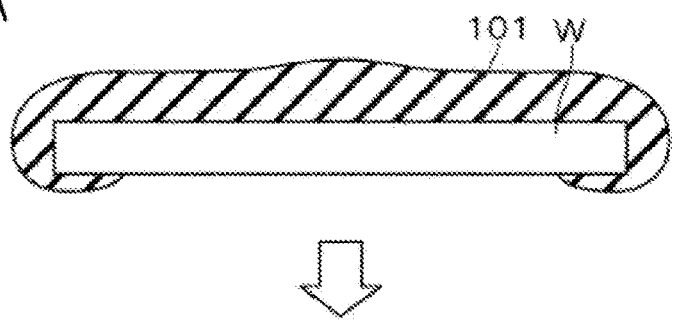
FIGS. 1A to 1C are schematic diagrams for showing a process during which powders are generated from a film formed at a back side of a wafer.
Figure 1A:

Since suppressing that the reaction gases penetrating toward a back of a wafer W only by contacting a clamp ring according to a conventional method is not sufficient, a film 101 may be formed at the lateral side or the back side of the wafer W, as shown in FIG. 1A.

Figure 1B:
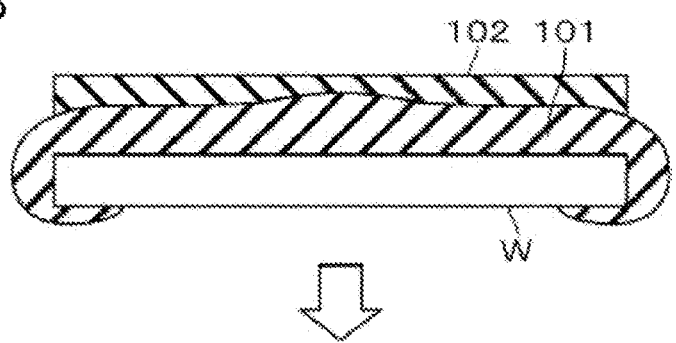
Figure 1B:
Figure 1C:
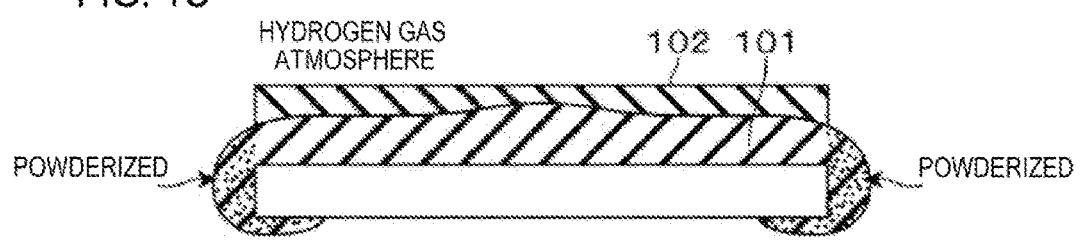

Especially, after forming the metal film of Ru or Ni, or the oxide film thereof, a passivation film 102 may be formed on a surface of the film 101 under an oxygen atmosphere (see FIG. 1B) Then heat treatment may be consecutively performed under a reduction atmosphere such as a hydrogen gas atmosphere or the like in the post processing (see FIG. 1C). In such a case, since the film 101 formed at the lateral side or the back side of the wafer W on which the passivation film 102 is not formed is exposed to the atmospheric oxygen, oxides are formed at least on the surface of the film 101. Consecutively, it is exposed to the reduction atmosphere, so that the oxides are reduced to metals. Since these metals produced through the reduction are especially easy to be powderized, it is highly considered that they become a pollution source by the contact with the transfer arm.

Thus, the inventor has developed the film forming apparatus having a clamp ling, which is more effective to suppress the penetration of the reaction gases round toward the back of the wafer W than a conventional film forming apparatus. Hereinafter, the film forming apparatus according to one embodiment of the present disclosure will be described by giving an example of forming an oxide film of Ru.

The film forming apparatus according to this embodiment reacts a reaction gas including the Ru (hereinafter, referred to as "Ru source") with an oxygen gas serving as a oxidizing gas to thereby form a thin film of ruthenium oxide ($RuO_2$) on a surface of the wafer having, for example, a diameter of 300 mm according to the ALD method.

Figure 2:
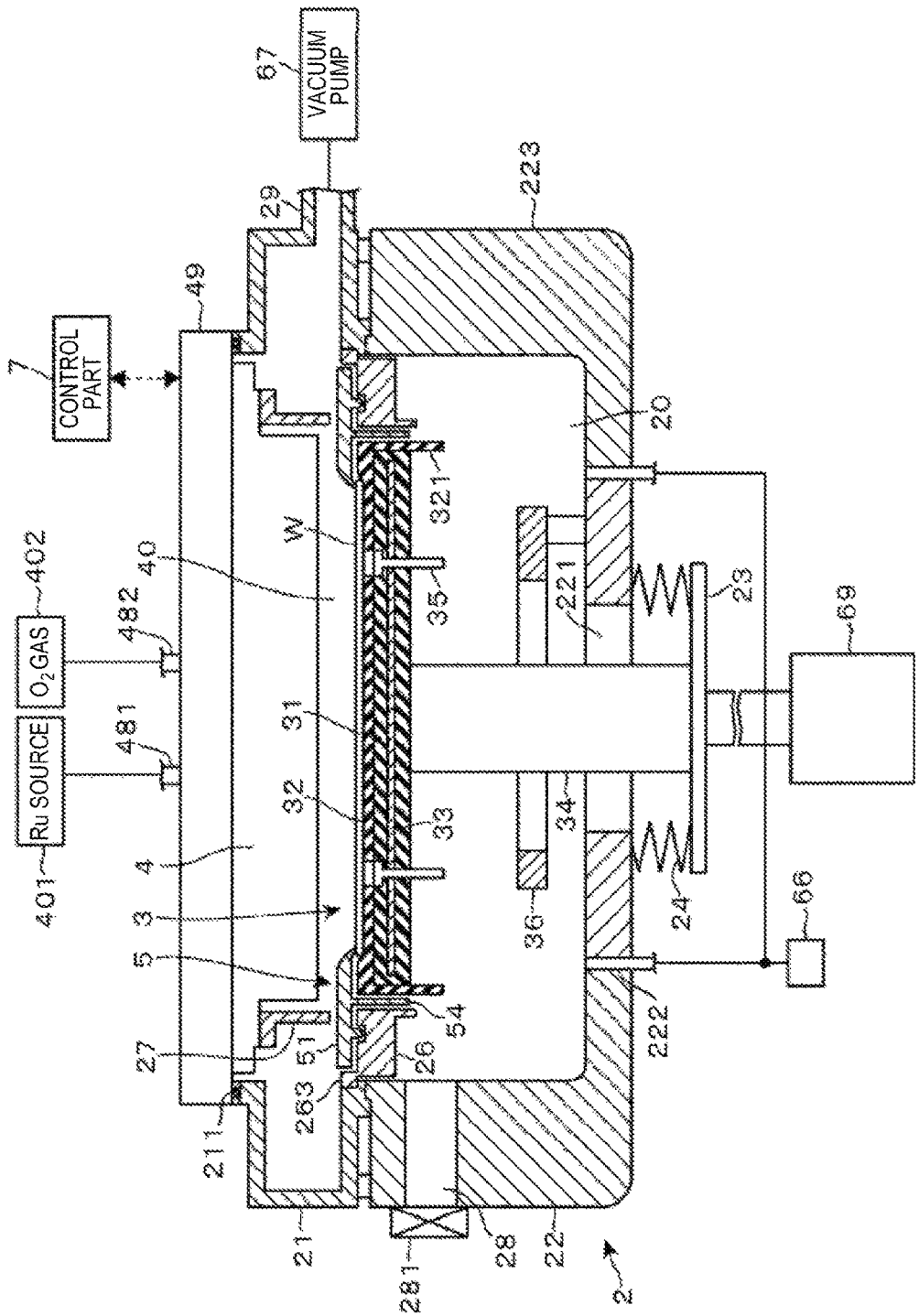
FIG. 2 is a vertical sectional side view of a film forming apparatus according to one embodiment.

As illustrated in a vertically sectional view of FIG. 2, the film forming apparatus includes a processing container 2 in which a vacuum atmosphere is formed inside, a mounting table 3 installed inside the processing container 2 to mount the wafer W, and a gas shower head 4 installed at an upper side of the processing container 2 and facing the mounting table 3 for supplying a process gas to the wafer.

The mounting table 3 includes a stage 31 for supporting the wafer W and a stage cover 32 for covering the stage 31, wherein the stage 31 is formed with materials, for example, aluminum nitride, quartz and the like in a circular plate shape. A stage heater 33, which is a wafer heating unit for heating a mounting surface of the mounting table 3 to raise a temperature of the wafer W up to a film forming temperature, is buried inside of the stage 31. The stage heater 33 is configured with, e.g., a resistive heating element of a sheet shape and receives a power from a power supply (not shown), thereby heating the wafer W mounted on the mounting table 3 to a temperature of, e.g., 250 degrees C. Further, an electrostatic chuck (not shown) is installed in the stage 31 to thereby fix the wafer W mounted on the mounting table 3 by electrostatic absorption. Further, the indication of the stage heater 33 is omitted in other figures except of FIGS. 2 and 11.

The stage cover 32 included in the mounting table together with the stage 31 mounting table covers a top surface and a lateral surface of the stage 31 to thereby prevent reactants such as reaction products or reaction by-products from being deposited on a surface of the stage 31. The stage cover 32 is comprised of, e.g., a detachable cover member made by quartz (called deposit shield), and a circular concave part, which has a diameter slightly larger than that of the wafer W, at a center region of a top surface of the stage cover 32, so that it makes it possible to perform location determination of the wafer W mounted on a mounting surface of the stage cover 32.

The mounting table 3 is configured such that, for example, a center portion of a bottom side of the stage 31 is supported by a pillar-shaped support member 34, and the support member 34 is lifted or lowered by an elevating mechanism 69. Further, as lifting and lowering the support member 34, the mounting table 3 is lifted and lowered between a delivery location for delivering the wafer W from/to a wafer transfer mechanism positioned outside and a processing location where wafer treatment is performed.

As shown in FIG. 2, the support member 34 passes through a bottom part of the processing container 2, particularly, a bottom part of a lower container 22, which will be described later. Then, the support member 34 is connected to an elevating plate 23 lifted/lowered by the elevating mechanism 69, wherein a gap between the elevating plate 23 and the lower container 22 is hermetically sealed by a bellows 24.

Further, the mounting table 3 includes, for example, three elevating pins 35 to support the back side of the wafer W and to lift/lower the wafer W with respect to a mounting surface of the mounting table 3. For example, as shown in FIG. 2, each elevating pin 35 pass through the stage 31 in an up and down direction such that a flat head of each elevating pin 35 is hung on a upper side of the stage 31 and a lower part thereof is protruded from a bottom surface of the stage 31 when the mounting table 3 is moved to the processing location of the wafer W.

An elevating member 36 having a ring shape is installed at a lower side of the each elevating pin 35 passing through the stage 31 and is moved up or down to lift or lower the respective elevating pins 35 when the mounting table 3 is lowered to the delivery location of the wafer W. As a result, the wafer W supported by these elevating pins 35 can be lifted or lowered with respect to the mounting surface of the mounting table (see FIG. 5).

Here, openings are formed at the position through which each elevating pin 35 passes in an upper surface of the stage cover 32 to accommodate head of the elevating pin 35. On this account, as shown in FIG. 2, when the mounting table 3 is moved to the processing location of the wafer W, the head of the elevating pin 35 is accommodated in the openings, so that a flat mounting surface of the wafer W is achieved at the upper side of the mounting table 3. Further, side wall parts of the stage cover 32 are extended up to the lower part of the stage 31 to thereby form a skirt part 321 surrounding a lower region of the stage 31 from the side.

Next, configuration of the processing container 2 will be described. The processing container 2 is configured such that an exhaust duct 21 formed in an annular shape is stacked on a flat bowl-shaped lower container 22. The lower container 22 is made of, e.g., aluminum, and a through hole 221 is formed at a bottom surface of the lower container 22, so that the support member 34 of the stage 31 passes through. Further, purge gas supply routes 222 at, e.g., 4 sites, adjacent to the through hole 221 are formed to supply a purge gas, e.g., a nitrogen gas or the like, which is provided from a purge gas supply source 66, to a space (i.e., a bottom space 20 described later) of the lower side of the mounting table 3. The purge gas supply routes 222 or the purge gas supply source 66 correspond to a purge gas supply unit according to this embodiment.

A carry-in/carry-out port 28 is formed at the side wall 223 of the lower container 22 to perform carry-in/carry-out of the wafer W by an outside wafer conveyance mechanism. The carry-in/carry-out port 28 is opened and closed by a gate valve 281.

The exhaust duct 21 is configured with a circular body formed by bending an angular-shaped duct made of, e.g., aluminum, and is stacked on the lower container 22 to thereby configure the processing container 2. An internal circumference surface of the exhaust duct 21 is opened to face toward a region of an upper part of the mounting table 3. Because an exhaust tube 29 is connected to an outer wall surface of the exhaust duct 21, it is possible to perform vacuum exhaust by using a vacuum pump 67 connected to the exhaust tube 29. The exhaust tube 29 or the vacuum pump 67 corresponds to an exhaust part according to this embodiment.

Further, in the processing container 2, an inner ring 26 is installed, which is an encompassing member to encompass the mounting table 3 positioned at the processing location and to divide an inner part of the processing container 2 into a processing space 40 of a upper side and the bottom space 20 of a bottom side encompassing member. The inner ring 26 is a ring shaped member formed with, e.g., aluminum, and formed in a shape capable of being loaded between an inside wall surface of the side wall 223 of the lower container 22 and a side circumference surface of the mounting table 3. A flange part 263 is formed at an outer circumference part of the upper side of the inner ring 26 to be widened toward the outer side, and the inner ring 26 is arranged in the processing container 2 such that the flange part 263 is hooked at the exhaust duct 21. Further, an upper surface of the inner ring 26 may be covered with a ring cover made of, e.g., quartz.

Figure 3:
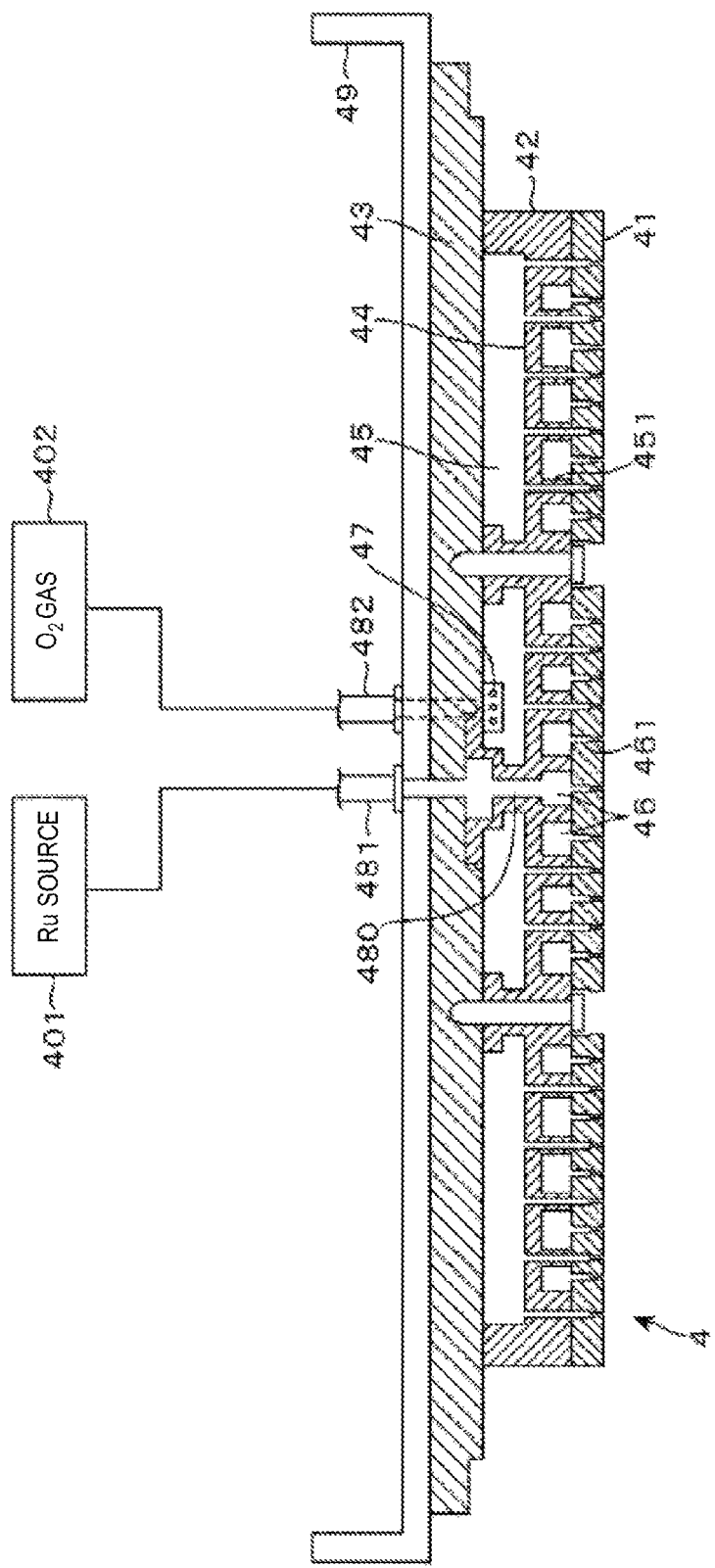
FIG. 3 is a vertical sectional side view of a gas shower head installed at the film forming apparatus.

The configuration of the gas shower head 4 will be described next. As shown in FIG. 3, the gas shower head 4 has a structure of dividing a space, which is encompassed by a flat ring-shaped side wall 42, a ceiling 43 and a bottom plate 41 covering the side wall 42 from above and below, into an upper space 45 and a lower space 46 by a disc shaped partition part 44 installed therein.

The lower space 46 is connected to a Ru source supply tube 481 via a Ru source supply path 480 passing through the upper space 45, and there is installed a Ru source supply part 401 including a raw material tank storing the Ru gas, a vaporizer, a flow control part or the like in an upper region of the Ru source supply tube 481. Because the Ru source supply path 480 is also connected to a purge gas supply unit (not shown), the Ru source supply path 480 is capable of supplying the purge gas such as a nitrogen gas to the lower space 46. The Ru source or the purge gas, which is provided to the lower space 46 via the Ru source supply path 480, is diffused into the lower space 46, and provided to the processing space 40 via a gas supply hole 461 installed at an entire surface of the bottom plate 41.

The upper space 45 is connected to an oxidizing gas supply tube 482 via an oxidizing gas supply part 47 installed at a bottom of the ceiling plate 43, and there is installed an oxidizing gas supply part 402 having an oxygen tank, a flow control part or the like in an upper region of the oxidizing gas supply tube 482. Oxygen gas supplied to the upper space 45 via the oxidizing gas supply part 47 is diffused into the upper space 45 and provided to the processing space 40 from the entire surface of the bottom plate 41 via a gas supply hole 451, formed to pass through the partition part 44, the lower space 46 and the bottom plate 41.

Although it is described above that the gas shower head 4 has a structure of supplying the Ru source and the oxygen gas from different flow paths to suppress deposition of deposits produced by reaction of the Ru source and the oxygen gas, a method for supplying the reaction gas is not limited thereto. For example, the Ru source and the oxygen gas may be supplied to the processing space 40 from a common flow path. In this case, a purge gas such as a nitrogen gas or the like is provided at the flow path when switching to the reaction gas such that the Ru source and the oxygen gas are not mixed to thereby suppress the deposition of deposits in the gas shower head 4.

The gas shower head 4 is supported from an upper side by using the support member 49, and an opening of an upper side of the exhaust duct 21 is closed by the support member 49 to thereby seal the processing container 2. An O ring 211 to keep an inside the processing container 2 airtight is installed between the exhaust duct 21 and the support member 49.

A bottom of the gas shower head 4, which is supported by the support member 49, is installed to face an upper side of the mounting table 3, and the reaction gas is provided to the processing space 40 positioned between the gas shower head 4 and the mounting table 3 to perform film forming treatment on the wafer W.

Further, a cylindrical baffle ring 27 is extended toward a lower side between the gas shower head 4 and the exhaust duct 21 to reduce flow conductance at a space therebetween for uniform exhaustion in a circumference direction of the processing container 2 through the processing space 40.

Figure 4:
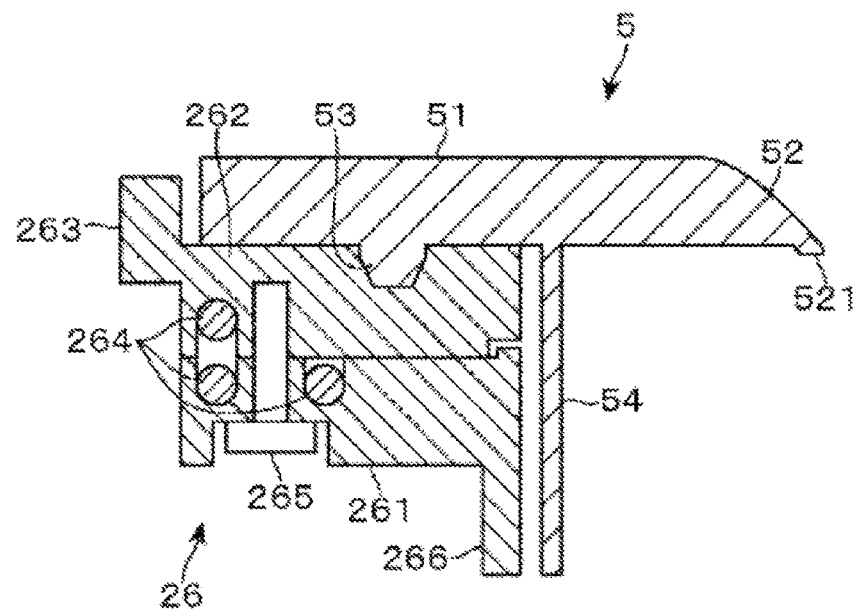
FIG. 4 is an enlarged vertical sectional view illustrating a configuration of a clamp ring and an inner ring installed at the film forming apparatus.

Further, in the film forming apparatus according to this embodiment, the clamp ring 5 is installed to prevent the reaction gases from moving to the back of a wafer W mounted on the mounting table 3. As shown in FIG. 2 and FIG. 4, the clamp ring 5 includes a main body part 51 formed in a circular ring-shaped plate, and is arranged in the processing container 2 with mounting a bottom of the main body part 51 on the inner ring 26. An inner circumference part 52 of the main body part 51 is extended further than an inner circumference surface of the inner ring 26 toward an inner part, and an inner cross-sectional part is positioned higher than an edge part of the wafer W mounted on the mounting table 3.

According to one embodiment, when the clamp ring 5 is loaded on the inner ring 26, the inner cross-sectional part of the inner circumference part 52 is extended further than an upper surface of the inner ring 26 toward a lower side. Because a contact surface 521, which is flat, is formed at a bottom of the inner cross-sectional part, it is possible to contact the contact surface 521 with an entire circumference portion of the wafer W mounted on the mounting table 3.

Figure 8:
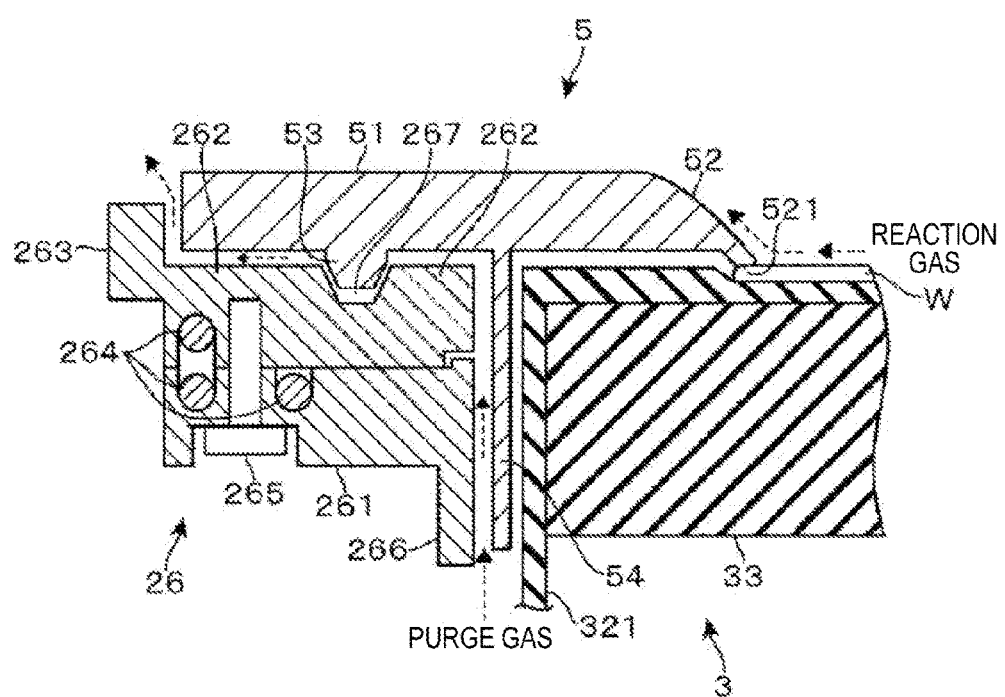
FIG. 8 is an explanation drawing for illustrating operations of the clamp ring and the inner ring.

At the bottom of the main body part 51, a cylindrical wall 54 is installed which is in a cylinder shape along a circumference direction of the clamp ring 5. As shown in FIG. 8, the cylindrical wall 54 is positioned between the mounting table 3 at the processing location and the inner ring 26.

Further, a plurality of convex parts 53 for determining a position of the clamp ring 5 is formed at a bottom of the main body part 51, and the convex part 53 is inserted into a concave part 267 (see FIG. 8) formed at the upper side of the inner ring 26 to determine the position of the clamp ring 5 on the inner ring 26.

The clamp ring 5 may be formed with a metal such as aluminum, etc., or a ceramic such as alumina, etc. The clamp ring 5 has a weight (e.g., hundreds of grams to kilograms) enough to suppress the penetration of the reaction gases round to the back side by pressing the contact surface 521 on the wafer W mounted on the mounting table 3.

Further, in the inner ring 26, there are formed a plurality of sheath heaters 264 serving as a preheating unit for preheating the clamp ring 5 for the purpose of preventing particles being produced due to peeling of the wafer W. Such particles are produced when brushing of the contact surface 521 against the wafer W due to thermal expansion of the main body part 51 subjected to a heat from the stage heater 33 when the main body part 51 is in contact with the wafer W. As shown in FIG. 4, the inner ring 26 according to this embodiment is configured such that an upper member 262 and a lower member 261 are vertically fastened by a bolt 265. The sheath heater 264 is arranged in a groove part formed along a junction surface of the lower member 261 and the upper member 262. Each sheath heater 264 heats the clamp ring 5 via the inner ring 26 by receiving power from the power supply (not shown). A heating temperature of the clamp ring 5 is controlled to a temperature, e.g., 280 degrees C., roughly balancing a temperature of the clamp ring 5 with a temperature of the wafer W mounted on the mounting table 3, after a heat supply from the sheath heater 264 is disappeared.

Further, as shown in FIG. 4, a cylindrical protrusion part 266 whose inner circumference surface is extended toward a lower side is formed in the lower member 261 of the inner ring 26, thereby enlarging a surrounding area of the cylindrical wall 54.

The film forming apparatus including above described elements comprises: a control part 7 configured to control a supply operation of the reaction gases supplied from the Ru source supply part 401 or the oxidizing gas supply part 402, an elevating operation of the mounting table 3, an exhaust operation in the processing container 2 by the vacuum pump 67, and a heating operation by the stage heater 33 or the sheath heater 264 or the like. For example, the control part 7 is configured with a computer including a CPU and a memory part (not shown), and a program on which a step (instruction) group for executing the operations described above is organized and recorded in the memory part. The program is stored in a memory medium such as a hard disc, a compact disc, a magnetic optical disc, a memory disc or the like and installed to the memory part from the memory medium.

Figure 5:
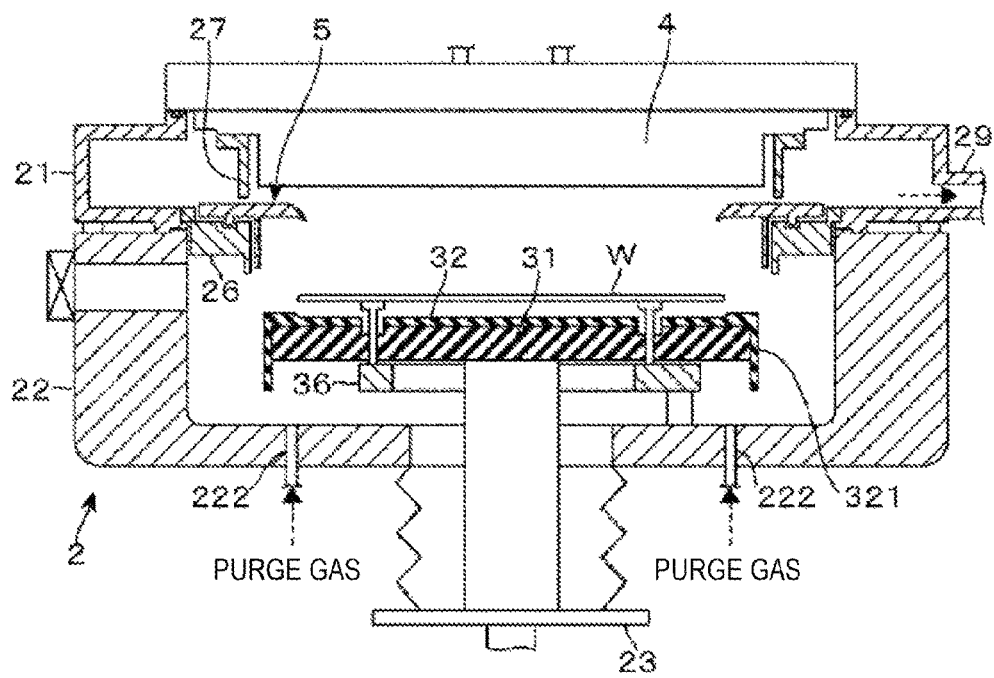
FIG. 5 is a first explanation drawing for illustrating operations of the film forming apparatus.

Hereinafter, a process of the film forming apparatus will be described by referring to FIG. 5 to FIG. 8. After the processing container 2 is depressurized at the vacuum atmosphere, the mounting table 3 is lowered to the delivery location, as shown in FIG. 5. Then, the gate valve 281 is opened, and the transfer arm of a wafer transfer device, which is installed in a vacuum transfer chamber connected to the carry-in/carry-out port 28, is entered to convey the wafer W between the each elevating pin 35. Thereafter, the each elevating pin 35 is descended to thereby mount the wafer W on the mounting table 3 heated by the stage heater 33.

Continuously, the gate valve 281 is closed, and the mounting table 3 is elevated to the processing location. As stated above, the inner circumference part 52 of the clamp ring 5, which is stacked on the inner ring 26, is extended such that the contact surface 521 is located lower than the upper surface of the inner ring 26.

On this account, as shown in FIG. 8, when the mounting table 3 is elevated to the processing location, the contact surface 521 of the clamp ring 5, which is extended to be located lower than the upper side of the inner ring 26, contacts the edge part of the wafer W through a whole circumference, so that the clamp ring 5 is lifted from the upper side of the inner ring 26. In this regard, the weight of the clamp ring 5 is applied to the contact surface 521, so that the clamp ring 5 is in close contact with the wafer W.

Further, at this time, because the clamp ring 5 is preheated by the sheath heater 264 after the clamp ring 5 is lifted from the inner ring 26, the temperature of the wafer W heated by the stage heater 33 and the temperature of the clamp ring 5 stacked on the wafer W are almost balanced. As a result, the thermal expansion of the clamp ring 5 is suppressed to thereby suppress particle generation caused by the brushing of the clamp ring 5 against the wafer W.

Figure 6:
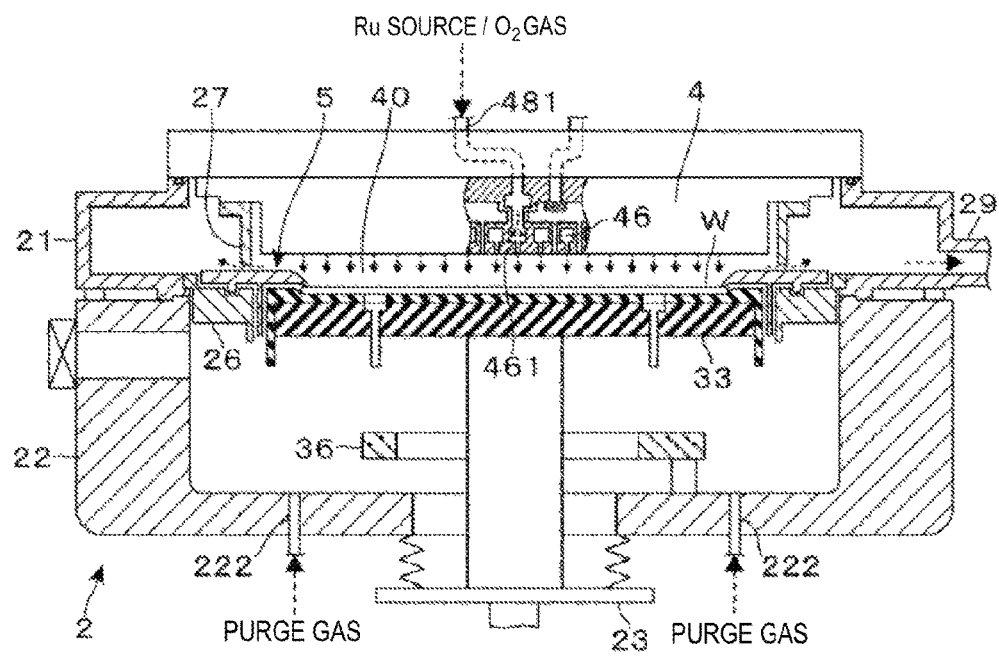
FIG. 6 is a second explanation drawing for illustrating operations of the film forming apparatus.

Then, after a pressure control of the inside of the processing container 2 is performed, the Ru source is provided from the Ru source supply part 401 (see FIG. 6). The Ru source provided to the gas shower head 4 is spread into an inside of the lower space 46 and discharged into a lower side toward a whole inside the processing space 40 via the gas supply hole 461. The Ru source discharged into the processing space 40 flows toward the wafer W mounted on the mounting table 3. If the Ru source is arrived at the surface of the wafer W, the Ru source is adhered to the wafer W.

The Ru source arrived at the wafer W is radially spread in a diameter direction along the surface of the wafer W and flows out toward the exhaust duct 21 from the processing space 40 via a gap between the baffle ring 27 and the clamp ring 5. The Ru source flowed in the exhaust duct 21 is exhausted outwards via the exhaust tube 29.

In this way, the Ru source, which is spread radially along the surface of the wafer W, as shown in FIG. 8, passes an upper side of the edge part of the wafer W. However, the inner circumference part 52 of the clamp ring 5 contacts the edge part through the whole circumference, and the weight of the clamp ring 5 is applied to the contact surface 521. Thus, the contact surface 521 is sufficiently adhered to the wafer W. Even though the Ru source has high penetrability, the Ru source may scarcely enter between the members, e.g., the contact surface 521 and the wafer W. As a result, it is suppressed that the Ru source flowing on surface of the wafer W flows into the lateral side or back side of the wafer to be absorbed.

Meanwhile, a gap is formed between the lower side of the clamp ring 5 lifted by the mounting table 3 and the upper side of the inner ring 26, and it may be possible that the Ru source enters into the mounting table 3 via this gap. Thus, as the cylindrical wall 54 positioned between the inner ring 26 and the mounting table 3 is installed in the lower side of the clamp ring 5, a flue space from an outer circumference part to the inner circumference part 52 of the clamp ring 5 is lengthened to thereby block delivery of the Ru source gas to the lateral side or the back side of the wafer W. Further, the purge gas, which is provided to the bottom space 20, flows through a gap between an inner circumference surface of the inner ring 26 and an outer circumference surface of the cylindrical wall 54 and between a lower side of the clamp ring 5 and an upper side of the inner ring 26 to thereby be exhausted to the exhaust duct 21. Due to the flow of the purge gas, it is possible to resend the Ru source entered into a lower side from the outer circumference part of the clamp ring 5.

The Ru source is supplied onto the surface of the wafer W while suppressing the penetration round to the back of the wafer W by using the clamp ring 5. When a predetermined time is elapsed, the supply of the Ru source is stopped, and the Ru source in the lower space 46 is purged by the nitrogen gas (see FIG. 6).

Figure 7:
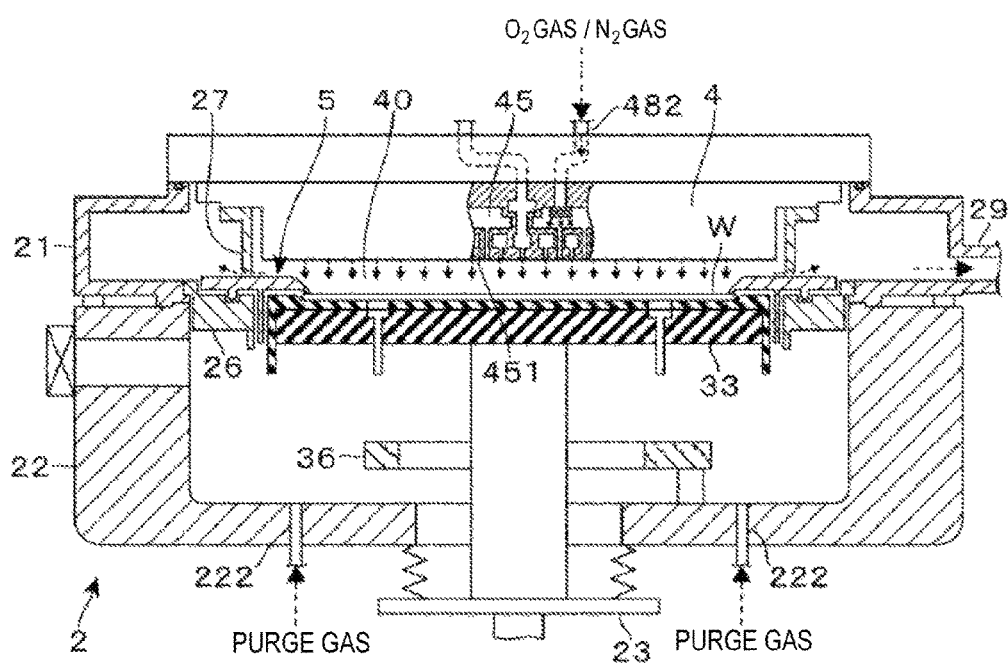
FIG. 7 is a third explanation drawing for illustrating operations of the film forming apparatus.

Thereafter, the oxygen gas is provided to the gas shower head 4 from the oxidizing gas supply part 402 (see FIG. 7). The oxygen gas provided to the gas shower head 4 is spread inside the upper space 45, and discharged into the lower side toward the whole inside of the processing space 40 via the gas supply hole 451. The oxygen gas discharged into the processing space 40 flows toward the wafer W mounted on the mounting table 3. When the oxygen gas is arrived at the surface of the wafer W, the oxygen gas reacts with the Ru source adhered to the wafer W to thereby form a RuO2 molecular layer. When a predetermined time is elapsed after the oxygen gas supply is initiated, the supply of the oxygen gas is stopped, and the oxygen gas in the upper space 45 is purged by the nitrogen gas (see FIG. 7).

The oxygen gas arrived at the wafer W flows in the same manner with the Ru source and toward the exhaust duct 21, but the edge part of the wafer W is covered with the clamp ring 5. Further, the cylindrical wall 54 obstructing entry of the oxygen gas into the wafer W from the outer circumference part of the clamp ring 5 is installed in the lower side of the clamp ring 5, there is formed a flow of the purge gas that the oxygen gas, which is entered into a gap between the clamp ring 5 and the inner ring 26, is sent back. By these operations, the penetration of the oxygen gas round toward the back of the wafer W mounted on the mounting table 3 is suppressed, and a formation of the RuO$_2$ at the lateral side or the back side of the wafer W is suppressed.

By repeating above described processes, the Ru source and the oxygen gas are supplied to the processing space 40 alternately, and the RuO$_2$ molecular layer is deposited on the surface of the wafer W to thereby form a RuO$_2$ film 101.

In this way, when a desired thickness of film 101 is formed by repeating, e.g., tens to hundreds times, the supply of the Ru source and the oxygen gas, the mounting table 3 is descended to the delivery location. The gate valve 281 is opened and the transfer arm is entered, as a reverse sequence for carrying-in of the wafer, the wafer W is transferred to the transfer arm from the elevating pin 35 to thereby carry-out a film formed wafer W, and then a carrying-in of a following wafer W is awaited.

The film forming apparatus according to this embodiment has following effect. Since the clamp ring 5 is lifted by the mounting table 3 via the contact surface 521 of the inner circumference part 52. The clamp ring 5 is stuck on the wafer W by having the inner circumference part 52 to contact through the whole circumference of the edge part of the wafer W mounted on the mounting table 3. The penetration of the reaction gases, e.g., Ru source gas, oxygen gas, round toward the back of the wafer W is effectively suppressed.

Further, the cylindrical wall 54 of a cylinder shape is formed in the clamp ring 5, and the cylindrical wall 54 is positioned between the mounting table 3 and the inner ring 26. As a result, the entry of the reaction gases via the lower side of the clamp ring 5 is suppressed, and it is possible to suppress the penetration of the reaction gases round toward the back of the wafer W.

Figure 9A:
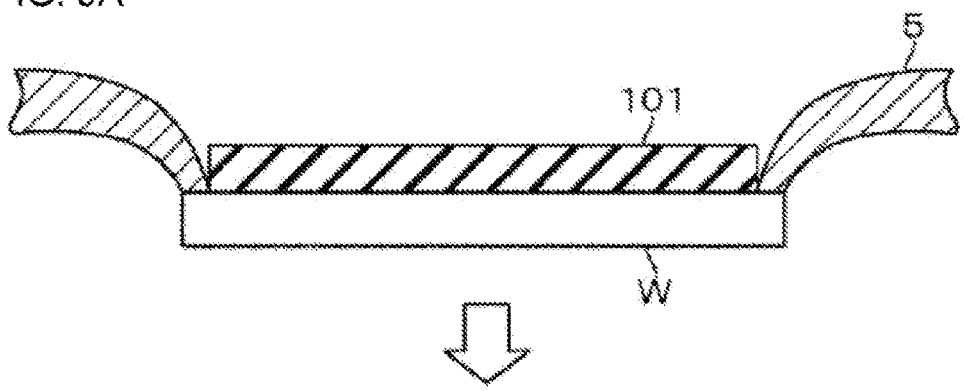
FIGS. 9A to 9C are schematic diagrams for explaining an operation and an effect of the clamp ring.
Figure 9B:
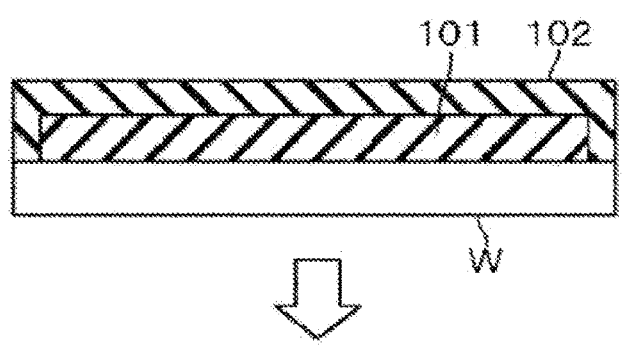
Figure 9C:
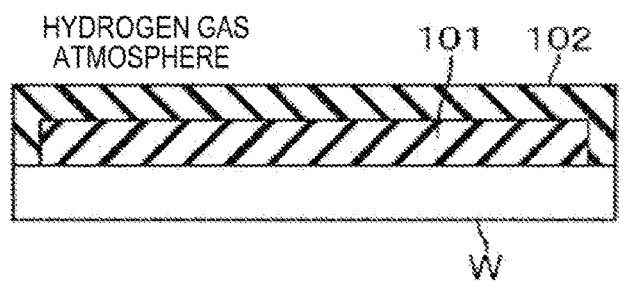

According to the film forming apparatus described above, as schematically shown in FIG. 9A, because the film forming is performed by using the clamp ring 5, it is possible to suppress the formation of the film 101 at the lateral side or the back side of the wafer W. As a result, when the passivation film 102 is formed on a surface of the film 101, a region not covered with the passivation film 102 is scarcely appeared (see FIG. 9B). Because a whole surface of the film 101 is covered with the passivation film 102, in case of performing the heat treatment in the reduction atmosphere, e.g., the hydrogen gas atmosphere, the film 101 is not exposed in the reduction atmosphere to thereby have an effect on preventing the formation of a metal being easy to be powderized (see FIG. 9C).

Figure 10:
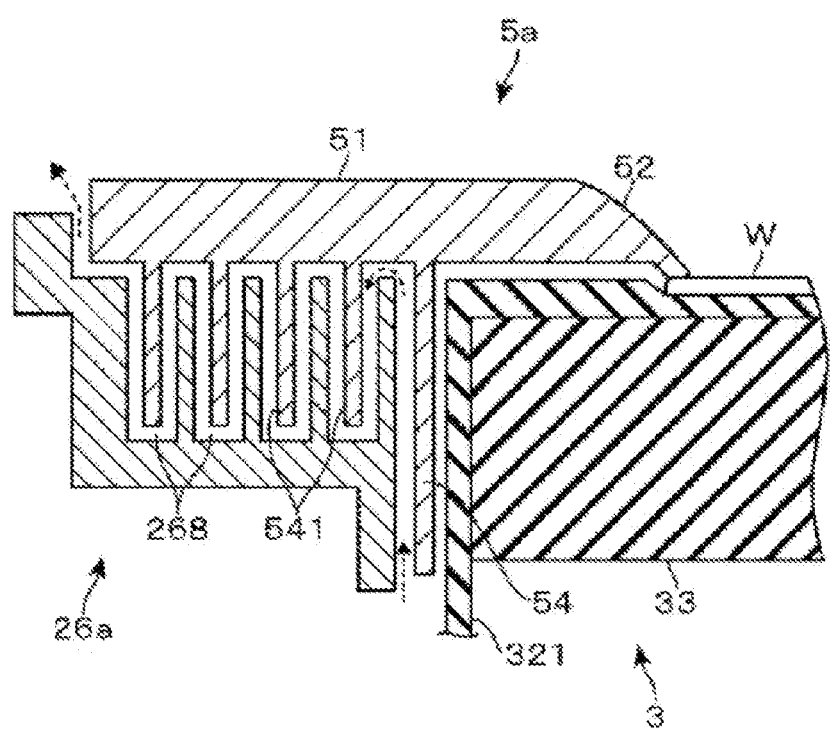
FIG. 10 is an enlarged vertical sectional view illustrating a modified example of the clamp ring.

FIG. 10 is showing an embodiment of forming one or more of outer tube walls 541 (An example of establishing a plurality of outer tube walls 541 is shown in FIG. 10), One or more outer tube walls 541 are extended from the bottom of the clamp ring 5a toward the lower side such that the cylindrical wall 54, which is positioned between the inner ring 26a serving as the encompassing member and the mounting table 3, is encompassed from the outer circumference side toward the circumference direction. Groove parts 268 are formed at the upper side of the inner ring 26a to insert the outer tube walls 541 thereto. Further, when the clamp ring 5a is lifted by the mounting table 3, a labyrinth seal is formed between the outer tube walls 541 and the groove parts 268. As a result, an effect for obstructing the entry of the oxygen gas from the outer circumference part of the clamp ring 5a is further improved.

In each embodiment described below, same numerals are assigned to common elements with the film forming apparatuses shown in FIGS. 2 to 4.

Figure 11:
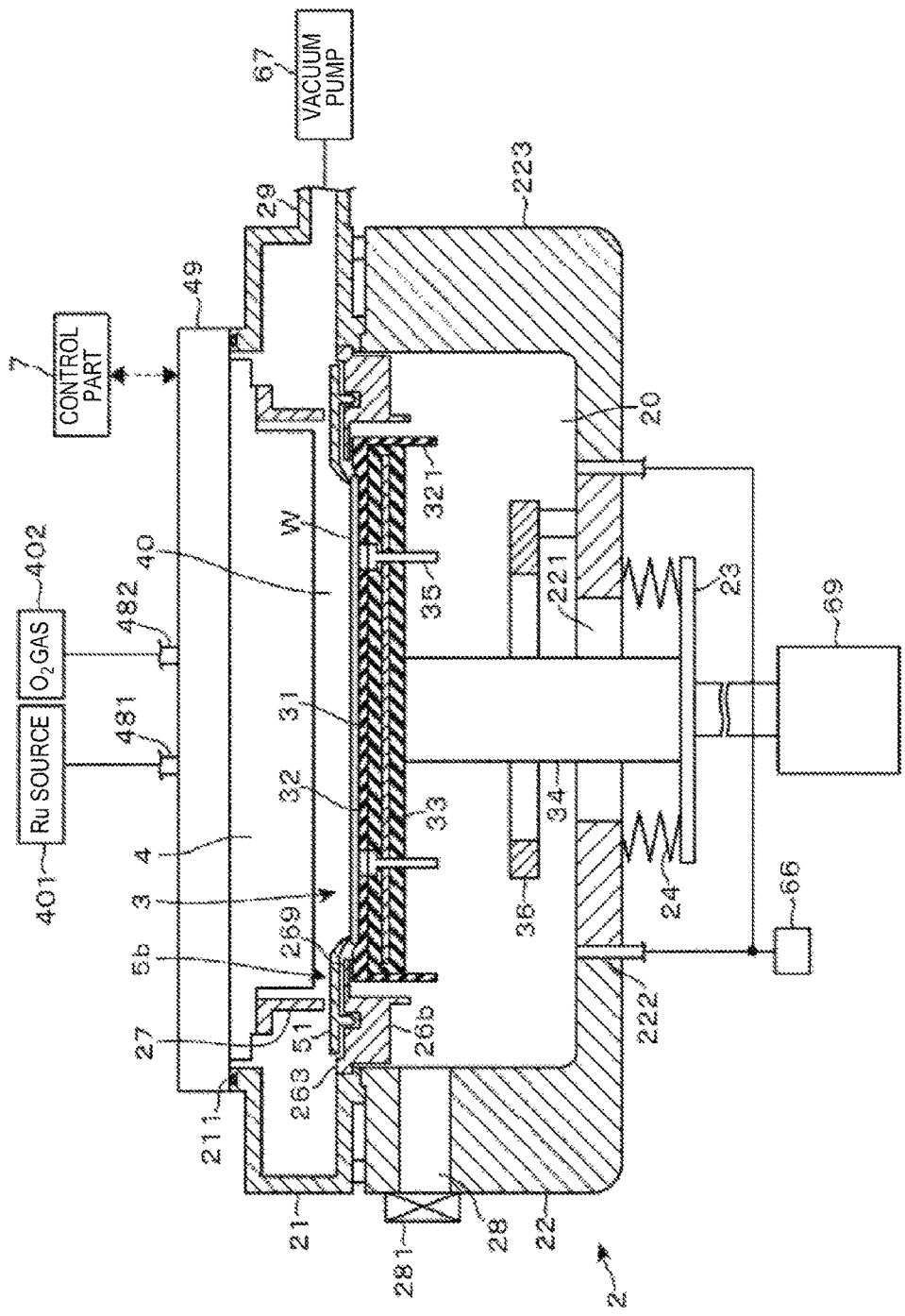
FIG. 11 is a vertical sectional view of the film forming apparatus according to the second embodiment.
Figure 12:
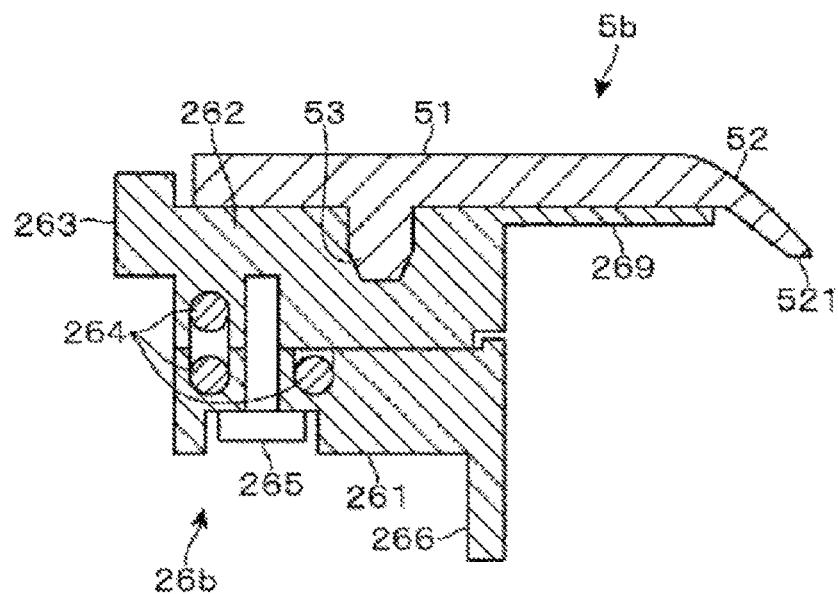
FIG. 12 is an enlarged vertical sectional view illustrating configuration of the clamp ring and the inner ring installed at the film forming apparatus of FIG. 11.
Figure 13:
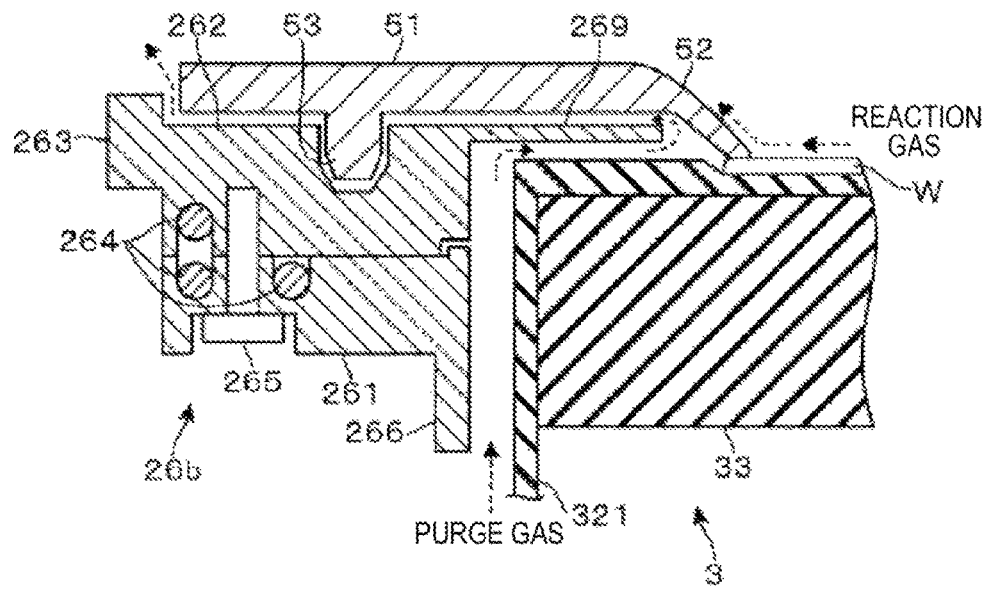
FIG. 13 is a diagram illustrating a process of the clamp ring and the inner ring of FIG. 12.

In sequence, a film forming apparatus according to the second embodiment of the present disclosure is described by referring to FIGS. 11 to 13. The film forming apparatus according to the second embodiment is different from the film forming apparatus according to the first embodiment. A guiding part 269, which is extended from the inner ring 26b serving as the encompassing member between the clamp ring 5b and the mounting table 3, is installed instead of the cylindrical wall 54 at the lower side of the clamp ring 5.

As shown in FIG. 12, the guiding part 269 is extended along the bottom of the clamp ring 5b from an upper part of the inner ring 26b toward an inner side. A front-end of the guiding part 269 is extended to a near position of the edge part of the wafer W mounted on the mounting table 3 to cover the edge part of the mounting table 3 from the upper side. Further, when the clamp ring 5b is stacked on the inner ring 26b, a height position of the contact surface 521, which is flat, of the inner edge part of the clamp ring 5b is lower than a bottom of the guiding part 269. As shown in FIG. 13, if the mounting table 3 is positioned at the processing location, the clamp ring 5b is lifted from the inner ring 26b by the mounting table 3 via the wafer W to thereby form a gap between the members 5b and 26b. The guiding part 269 is arranged at the gap. As a result, in the upper and lower side of the guiding part 269, a flow path is formed through which the purge gas supplied at the bottom space 20 flows.

As the purge gas flows along this flow path, the purge gas is guided by the guiding part 269 to be entered into the processing space 40 through the lateral side of the wafer W mounted on the mounting table 3. As the flow of the purge gas is formed at the lateral side of the wafer W, the reaction gas is sent back by the purge gas even if the reaction gas is entered from the outer circumference part of the clamp ring 5b. Especially, because the front-end of guiding part 269 is extended to the near position of the wafer W mounted on the mounting table 3, a substitution of the reaction gas flowed in near the wafer W by the purge gas is performed and it is difficult for the reaction gas to be remained underneath wafer W. By this synergy effect, the penetration of the reaction gas round toward the back of the wafer W is effectively suppressed.

As described above, the clamp ring 5, 5a, or 5b installed in the film forming apparatus suppresses the reaction gases having high penetrability from penetrating. Accordingly, only using the metal source including the Ru or the Ni which has low tendency of permeation as the reaction gas may yields better results for film formation.

As an embodiment of the metal source, there is shown a case that the film of the metal or the oxides thereof is formed by using the reaction gases including elements, such as period 3 elements, e.g., Al, Si, or the like, of the periodic table, period 4 elements, e.g., Ti, Cr, Mn, Fe, Co, Cu, Zn, Ge, or the like, of the periodic table, period 5 elements, e.g., Zr, Mo, Rh, Pd, Ag or the like, of the periodic table, and period 6 elements, e.g., Ba, Hf, Ta, W, Re, Ir, Pt, or the like, of the periodic table. As the metal source being absorbed at the wafer W surface, there is a case of using an organometallic compound or a non-organometallic compound of the metal elements as the reaction gas.

Further, for example, an oxidation reaction using, e.g., $O_2$, $O_3$, $H_2O$, a reduction reaction using organic acids, e.g., $H_2$, $HCOOH$, $CH_3COOH$, and alcohols, e.g., $CH_3OH$, $C_2H_5OH$, a carbonization reaction using, e.g., $CH_4$, $C_2H_6$, $C_2H_4$, $C_2H_2$, or a nitrification reaction using, e.g., $NH_3$, $NH_2NH_2$, $N_2$, and the like may be used as a reaction for obtaining a desirable film by reacting a base source absorbed at the surface of the wafer W.

Further, 3 kinds of reaction gases or 4 kinds of reaction gases may be used as the reaction gas.

The film forming method for forming the film 101 at the surface of the wafer W is not limited to the ALD method. For example, the present disclosure is applied to various CVD methods such as a thermal CVD method continuously supplying the metal source into the processing container 2 and decomposing the metal source at the surface of the heated wafer W to thereby obtain a thin film or a plasma CVD method activating and reacting the metal source and the reaction gas under existence of plasma to thereby perform continuous film formation.

EXAMPLE

Experiment

The penetration of the reaction gas round toward the back of the wafer W is compared for the case using the clamp ring 5 and the case not using the clamp ring 5.

A. Experimental Condition

<Embodiment>

The film formation of $RuO_2$ film is performed by using the film forming apparatus including the identical configuration shown in FIG. 2 and alternately supplying the Ru source and the oxygen gas at the surface of the wafer W <Comparison Embodiment>

The film formation of $RuO_2$ film is performed by using the film forming apparatus in which the clamp ring 5 is not installed under the identical condition of the embodiment.

B. Experimental Result

Figure 14:
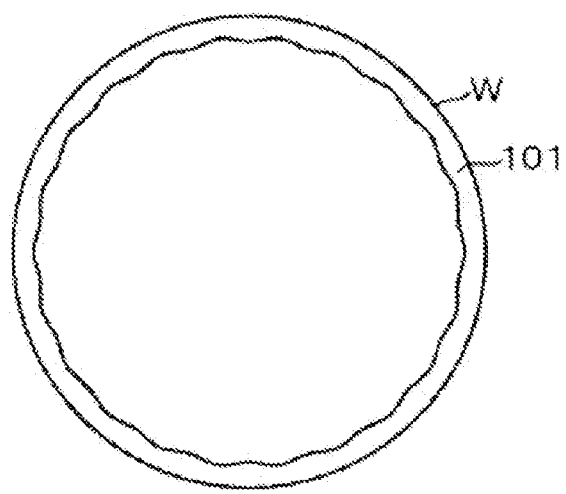
FIG. 14 is a schematic diagram illustrating a film forming condition at a back side of the wafer according to a comparison example.

According to a result of the embodiment, there is no the film formation of the $RuO_2$ at the back side of the wafer W. Meanwhile, according to a result of the comparison embodiment, as schematically shown in FIG. 14, the $RuO_2$ film is formed in a ring shape at the back side of the wafer W. Through this comparison, by using the clamp ring 5 according to the embodiment, even though the Ru source has high penetrability, it is possible to prevent the reaction gases from moving to the back of the wafer W.

In the present disclosure, because the clamp ring is lifted by the mounting table to thereby stick the clamp ring on the wafer by using the clamp ring including the inner circumference part contacting through the whole circumference of the edge part of the wafer mounted on the mounting table, the penetration of the reaction gases round toward the back of the wafer is suppressed.

In one embodiment, there is installed the cylindrical wall extending toward the lower side from the clamp ring and shaped as a cylinder, and the cylindrical wall is positioned between the mounting table and the inner ring surrounding the mounting table. As a result, because the entry of the reaction gases via the lower side of the clamp ring is suppressed, it is possible to prevent the penetration of the reaction gases round toward the back of the wafer.

Further, in another embodiment, because there is formed the guiding part to be extended between the mounting table and the clamp ring with the purge gas supply from the lower side of the mounting table, there is formed the flow passing the lateral side of the wafer mounted on the mounting table 3 of the purge gas. As a result, because the reaction gas is difficult to stay underneath with the reaction gas flowed through the gap between the clamp ring and the encompassing member, the diffraction of the reaction gas underneath the wafer is suppressed by this synergy effect.

While certain embodiments have been described, these embodiments have been presented by way of example only, and are not intended to limit the scope of the disclosures. Indeed, the novel embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming apparatus for performing film formation by supplying a reaction gas to a wafer located in a processing container under a vacuum atmosphere, the film forming apparatus comprising:
   a mounting table, on which the wafer is mounted, installed in the processing container and configured to be lifted/lowered between a processing location for performing the film formation and a delivery location for delivering the wafer from outside of the processing container at a lower side of the processing location;
   an encompassing member configured to encompass the mounting table positioned at the processing location and to divide an inside of the processing container into a processing space of an upper side in which the reaction gas is supplied and a space of a lower side, the encompassing member including a cylindrical protrusion part;
   an exhaust part configured to perform vacuum exhaustion inside the processing container through the processing space;
   a clamp ring stacked on an upper surface of the encompassing member when the mounting table is positioned at the delivery location and lifted from the upper surface of the encompassing member while contacting an inner circumference part thereof with an outer circumference of the wafer mounted on the mounting table when the mounting table rises to the processing location, the inner circumference part extending vertically further than an upper surface of the encompassing member toward a lower side at the delivery location; and
   a cylindrical wall thinly extended downward from a portion of a lower surface of the clamp ring, formed along circumference of the clamp ring in a cylinder shape, and positioned between an outer circumference surface of the mounting table and an inner circumference surface of the encompassing member, the cylindrical wall having a uniform thickness extending along the length thereof and the cylindrical wall and the clamp ring forming a T-shape in a vertical sectional side view,
   wherein the cylindrical protrusion part faces an outer circumference of the cylindrical wall and extends towards a lower side of the film forming apparatus, thereby enlarging a surrounding area of the cylindrical wall,
   wherein when the mounting table rises to the processing location, the clamp ring is lifted from the upper surface of the encompassing member to thereby form:
   a first horizontal gap between the upper surface of the encompassing member and a first portion of the lower surface of the clamp ring;
   a first vertical gap between the inner circumference surface of the encompassing member and the outer circumference surface of the cylindrical wall, the first vertical gap communicating with the first horizontal gap;
   a second horizontal gap defined by a portion of an upper surface of the mounting table in which the wafer is not mounted, a second portion of the lower surface of the clamp ring which the wafer is not in contact with, and the outer circumference of the wafer; and
   a second vertical gap between the outer circumference surface of the mounting table and an inner circumference surface of the cylindrical wall, the second vertical gap communicating with the second horizontal gap.

2. The film forming apparatus of claim 1, further comprising:
   a purge gas supply unit configured in such a manner that a flow of a purge gas from the lower side space to the processing space is formed via the first horizontal gap and the first vertical gap by supplying the purge gas to the lower side space.

3. The film forming apparatus of claim 1, wherein the clamp ring includes one or more outer tube walls formed in a cylinder shape for circumferentially encompassing the cylindrical wall, wherein a groove part, at which the outer tube wall is inserted, is formed in the encompassing member.

4. The film forming apparatus of claim 1, wherein a film formed by the reaction gas is a film to be powderized in post processing.

5. The film forming apparatus of claim 4, wherein the film includes ruthenium (Ru), nickel (Ni), or oxides thereof, and the post processing includes processes to form oxides of the Ru or the Ni at least on a surface of the film by exposing the film under an oxidizing atmosphere, and then to reduce the oxides.

6. The film forming apparatus of claim 1, wherein the mounting table includes a wafer heating unit configured to heat the wafer, and the encompassing member includes a preheating unit configured to preheat the clamp ring stacked on an upper surface of the encompassing member for suppressing thermal expansion of the clamp ring lifted by the mounting table.

7. The film forming apparatus of claim 1, wherein a circular concave part is formed at a center portion of the upper surface of the mounting table,
   the wafer is mounted on the circular concave part, and
   the portion of the upper surface of the mounting table defining the second horizontal gap is located further out from a center of the mounting table than the circular concave part.

8. The film forming apparatus of claim 1, wherein the mounting table includes a stage for supporting the wafer and a stage cover which covers the stage,
   the a circular concave part is formed at a center portion of the upper surface of the stage cover,
   the wafer is mounted on the circular concave part, and
   the portion of the upper surface of the mounting table defining the second horizontal gap is located further out from a center of the mounting table than the circular concave part.

9. The film forming apparatus of claim 8, wherein the stage cover includes a skirt part surrounding a lower region of the stage from side walls of the stage.

* * * * *